United States Patent [19]

Claussen

[11] Patent Number: 4,486,802

[45] Date of Patent: Dec. 4, 1984

[54] DRIVING CIRCUIT FOR SHORT CIRCUIT-PROOF READOUT STAGES

[75] Inventor: Claus-Jürgen Claussen, Leimen, Fed. Rep. of Germany

[73] Assignee: Brown, Boveri & Cie AG, Mannheim-Käfertal, Fed. Rep. of Germany

[21] Appl. No.: 451,480

[22] Filed: Dec. 20, 1982

[30] Foreign Application Priority Data

Dec. 21, 1981 [DE] Fed. Rep. of Germany ....... 3150703

[51] Int. Cl.$^3$ ............................................ H02H 9/02
[52] U.S. Cl. ........................................ 361/93; 361/98; 361/101
[58] Field of Search .................. 361/93, 98, 100, 101, 361/54

[56] References Cited

U.S. PATENT DOCUMENTS

| 4,047,233 | 9/1977 | Yorks et al. | 361/101 X |
| 4,321,648 | 3/1982 | Kaplan | 361/101 |
| 4,377,835 | 3/1983 | Asplund et al. | 361/100 X |

Primary Examiner—Reinhard J. Eisenzopf
Attorney, Agent, or Firm—Herbert L. Lerner; Laurence A. Greenberg

[57] ABSTRACT

Driver circuit for short-circuit-proof readout with a plurality of protection-wired inputs and outputs, including three comparators being connected to the inputs and being referred to a reference voltage, a first AND gate being switched into conduction if a positive voltage is present at the first comparator, a first switch being opened when the first AND gate is conducting and being connected to negative potential when closed, three current sources being connected to the outputs and to the first switch, a Darlington stage being connected to the outputs and to the current sources, an evaluation unit being connected to the outputs and to the current sources, an OR gate being influenced by the evaluation unit, a second switch being operated by the OR gate, an external capacitor input connected to the second switch for charging through a fourth current source and discharging through a current sink, three Schmitt triggers being different thresholds and being charged through the capacitor terminal, a second AND gate connected to the OR gate for controlling charging and discharging, and a second transistor stage connected to the outputs and to the Schmitt triggers.

1 Claim, 1 Drawing Figure

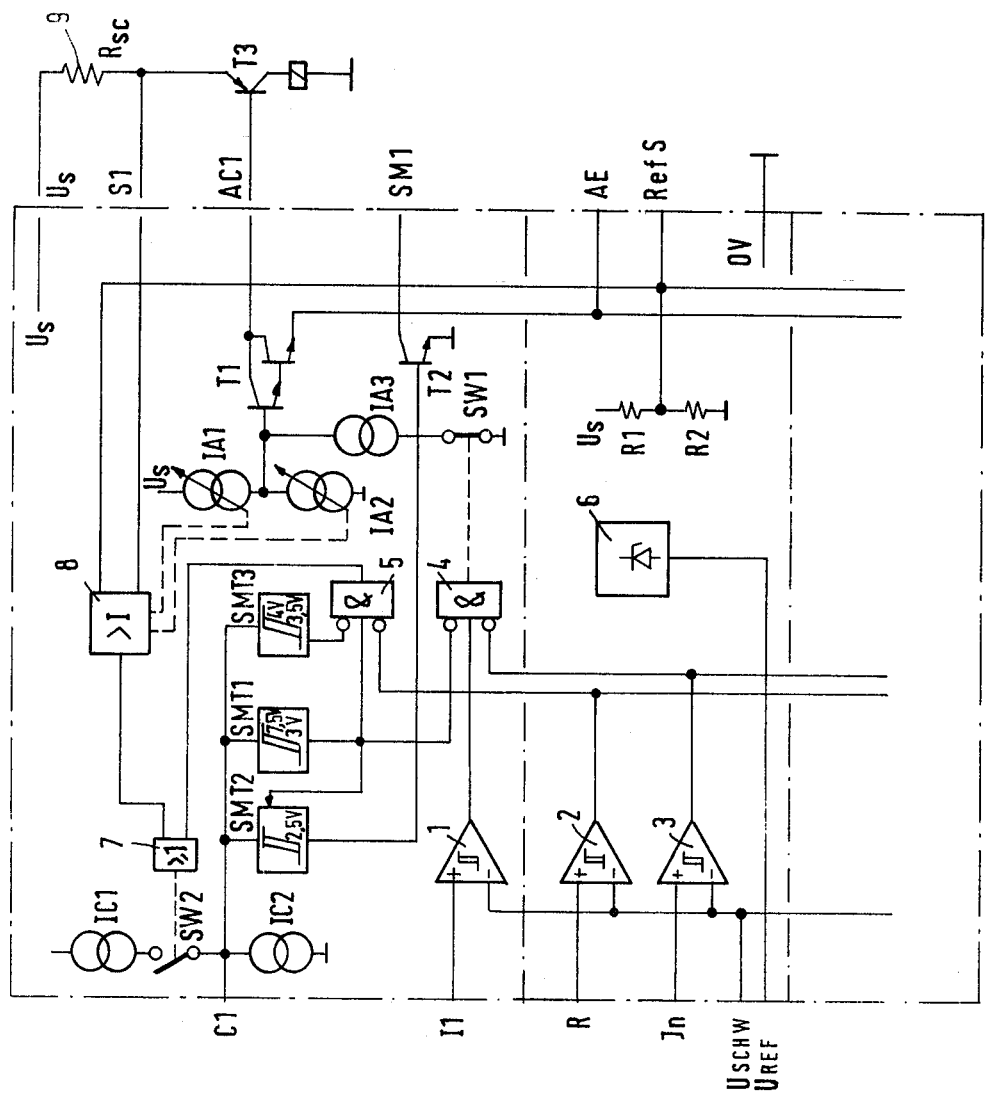

DRIVING CIRCUIT FOR SHORT CIRCUIT-PROOF READOUT STAGES

The sole FIGURE relates to a driving ciruit for short circuit-proof readout stages with several protection-wired inputs and outputs, in the field of electronic control technology.

The driving of lamps, relays, contactors and magnetic valves by electronic control, regulating and data processing facilities requires the use of rugged, short circuit-proof and overload-proof universally employable, cost-effective power stages.

A circuit configuration for a universal integrated short circuit-proof power circuit with several protection-wired inputs for binary input signals and several protection-wired outputs is known from German Published, Non-Prosecuted application No. DE-OS 28 25 752. Through an integrated power section, this circuit can drive all kinds and types of transistor stages besides lamps; the circuit can be monitored at an output for short circuits and open wires and can indicate fault currents to ground and to the supply voltage. While this circuit can be employed universally, it is heat-sensitive because of its power section and cannot always be used for specific circuit problems.

Integrated circuits for relay and lamp drivers are known from a brochure of the firm Thomson-CSF on "Circuit de interface TDE 1767 et 1787". The power transistor (output stage) in this case is integrated in. In the event of a short circuit or overload, the module disconnects the load current and periodically checks whether or not the excessively large current still exists. The increased current is ascertained through an external measuring resistor. While the construction of this circuit is very compact and normally offers to the user a large number of possible applications, it cannot be applied in special cases. This module is used according to the guidelines of the applicable data sheet, and its use is limited thereby. A further disadvantage is that an additional thermal stress occurs due to the likewise integrated-in output stage. While this circuit can be employed in many cases, it is not universally usable and cannot be expanded for special problems.

It is, accordingly, an object of the invention to provide a driving circuit for short circuit-proof readout stages which overcomes the hereinafore-mentioned disadvantages of the heretofore-known devices of this general type, and which is sufficient for many simple applications, while being expandable and adaptable if desired for special cases in many directions. It should further be possible with the driving circuit according to the invention to further connect an external power transistor, so that different commercially available power transistors can be employed at this point.

With the foregoing and other objects in view there is provided, in accordance with the invention, a driving circuit for short-circuit-proof readout stages with a plurality of protection-wired inputs and outputs, comprising a signal input, a first comparator having a first input connected to the signal input, a second input referred to a reference voltage and an output, a first AND gate being driven by the first comparator and having first, second and third inputs and an output, the first input being connected to the output of the first comparator, the first AND gate being switched into conduction if a positive voltage is present at the output of the first comparator, a first switch being operatively connected to the output of the first AND gate, the first switch being opened when the first AND gate is conducting and being connected to a negative potential when closed, first, second and third current sources, the first controlled current sources being connected to a supply potential, the third current source being connected to the first switch and being connected to the negative potential through the first switch when the first switch is closed, and being disconnected from the negative potential when the switch is open, a Darlington driver stage having an emitter, having a collector output and having a base being connected to the third current source and being connected to the first current source for supplying the Darlington stage when the first switch is open, a power output being connected to the collector output of the Darlington stage, a voltage supply output being connected to the emitter of the Darlington stage, the second current source being shunted across the third switched current source and being connected to the base of the Darlington stage, an evaluation circuit, the first and second current sources being connected to and addressed by the evaluation unit, a current sensor input and a threshold voltage output being connected to and influencing the evaluation unit, an OR gate being connected to and influenced by the evaluation unit, a second switch being operatively connected to the OR gate, a fourth current source and a current sink or other source each being connected to the second switch, an input terminal for an external capacitor being connected to the second switch for selectively changing through the fifth current source and discharging through the current sink, first, second and third Schmitt triggers each having an output, each having a different switching threshold and each being connected to the external capacitor input terminal for receiving a capacitor charge, the second Schmitt trigger having a setting input, a second AND gate having first, second and third inputs and having an output connected to the OR gate for controlling external capacitor charging and discharging, the output of the first Schmitt trigger being connected to the second input of the first AND gate, to the first input of the second AND gate and to the setting input of the second Schmitt trigger, the output of the third Schmitt trigger being connected to the second input of the second AND gate, a disturbance or trouble alarm output, a second transistor stage being connected between the disturbance alarm output and the output of the second Schmitt trigger, an acknowledgement input, a second comparator having a first input connected to the acknowledgement input, a second input referred to the reference voltage and an output connected to the third input of the second AND gate, another input, and a third comparator having a first input connected to the other input, a second input referred to the reference voltage and an output connected to the third input of the first AND gate.

It is an advantage of the driving circuit according to the invention that it can be employed universally even for special problems. Because of the only seemingly disadvantagous aspect of the externally connectable power stage, it is possible to assume that the circuit with its basic functions is of simple and inexpensive construction and nevertheless satisfies the customary broad field of applications and can be used in an easy-to-apply and comfortable manner because of the different additional wiring possibilities and the great latitude of possible structures. Thus, for instance, readout stages for any desired current magnitude can be driven.

Since the driving circuit according to the invention is constructed in integrated technology it is possible to accommodate an additional identically constructed driving circuit as a further functional unit in a standard dual-in-line housing. An integrated circuit thus is form by using the circuit configuration according to the invention twice, with a common supply part. By separating the cost-wise very expensive power section from the integrated circuit, heat problems no longer arise and the operating data are improved considerably.

In the event of a short circuit at the output or a low-resistance load, the driving circuit according to the invention prevents the destruction of the external output stage or the circuit. The circuit according to the invention further processes the input signal for driving the output stage and monitors the output stage in the event of a short circuit or overload. The disturbance of an overload can be stored and indicated. The storage can be reset through an acknowledgement (clearing) input. The output stage can be reconnected by a positive acknowledgement (clearing) signal. The disconnect and reconnect condition in any disturbance cases can be delayed in addition, so that short-time overloads such as a switching-on surge, do not lead to a disconnect action. Advantageously, the current is limited during this overload phase in the driving circuit according to the invention.

After a disconnect action, a pause for recovery (thermal recovery time) of the stressed components is as a rule required. The switching off delay, the duration of the pause and also the acknowledgement signal, are determined as to their magnitude by a single capacitor which can be added externally. The clearing in the case of a short circuit or overload can take place only after the thermal overload has ceased. This time is provided by the discharge of the external capacitor. All timing conditions from the indication of the disturbance to the resetting are met disadvantageously only by the single external capacitor in conjunction with three Schmitt triggers.

Other features which are considered as characteristic for the invention are set forth in the appended claims.

Although the invention is illustrated and described herein as embodied in a driving circuit for short circuit-proof readout stages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing, which is a schematic circuit diagram of an embodiment of the driving circuit according to the invention.

Referring now in detail to the drawing, it is seen that the driving circuit according to the invention is constructed as a functional unit in a rugged, bipolar driving circuit RBT in integrated technology. Within this integrated circuit, the functional unit is provided twice. Thus, the RBT is formed of two identical functional units and a common part.

For simplification, the second functional unit is only shown by outlines in the drawing of the embodiment.

The driving circuit according to the invention includes inputs I1, R (reset), Jn (inhibit) and $U_{SCHW}$. Outputs are designated with reference symbols $U_{REF}$, AC1, SM1 and AE. The terminals S1 and RefS serve for monitoring the load current. A capacitor can be connected to a terminal C1. The supply voltage is applied to terminals $U_S$ and OV. Protective diodes which are connected to the inputs and outputs and are to carry off interference potentials in practical use, are not shown in the drawing for the sake of clarity. A current-measuring resistor 9 and a power transistor T3 with a relay are connected to the outputs S1 and AC1 as the load in the collector branch.

The inputs I1, R and Jn are respectively brought to positive inputs of comparators 1, 2, 3. Negative inputs of the comparators 1, 2, 3 are jointly connected to the input terminal $U_{SCHW}$. The switching threshold of the comparators is fixed by a threshold voltage, fed-in externally through this terminal.

The signal input I1 is followed by the comparator 1, the input R (reset=resetting, acknowledging or clearing input) is followed by the comparator 2 and the input Jn (inhibit) is followed by the comparator 3. The input Jn serves for disconnecting all signal channels with priority. All three inputs I1, R and Jn respond actively to a "1" signal. The three comparators 1, 2, 3 have a Schmitt trigger characteristic, i.e., they have fixed switching thresholds with hysteresis.

An internal voltage source 6 is provided for forming a reference voltage for the output $U_{REF}$. This reference voltage at the output $U_{REF}$ is formed from the supply voltage at the terminal $U_S$, such as by a Zener diode, and can be brought to the input $U_{SCHW}$ through a jumper.

The outputs of the comparators 1 and 3 are connected to an AND gate 4 with inhibiting inputs. The comparator 1 is connected to the true or real input, and the comparator 3 is connected to an inverting input of the AND gate. The output of the comparator 2 is connected to one inverting input of a further AND gate 5. The inputs of three Schmitt triggers SMT1, SMT2 and SMT3 are connected to the C1 terminal (external capacitor). Each of these Schmitt triggers has a different switching threshold. The output of the Schmitt trigger SMT1 is brought to the setting input of the Schmitt trigger SMT2 (the Schmitt trigger SMT2 has no upper switching threshold but is set by a setting input like a memory), to the true input of the AND gate 5 and to an inverting input of the AND gate 4. The output of the Schmitt trigger SMT2 is brought to the disturbance indicating output SM1 through a transistor stage T2. The output of the Schmitt trigger SMT3 is connected to an inverting input of the AND gate 5. Further connected to the inputs of the Schmitt triggers SMT1, SMT2, SMT3 are a current sink IC2 and a current source IC1, through a switch SW2. The switch SW2 is controlled by an OR gate 7, one input of which is connected to the output of the AND gate 5.

The output of the AND gate 4 addresses a switch SW1, which connects a current source IA3 to negative potential. The positive side of the current source is connected to the base of a Darlington transistor transistor T1. The current source is further connected to a current source IA2 tied to minus potential and to a current source IA1 tied to the operating voltage $U_S$. Both of the current sources IA1 and IA2 are controlled by an evaluation circuit 8. The evaluation circuit 8 is normally passive while it influences the current sources IA1 and IA2 in the event of an overload and addresses the OR gate 7 with a "1" signal.

The Darlington stage T1, which is addressed at the base thereof by the current sources IA1, IA2, IA3, has the collector thereof connected to the power output AC1. The after-connected power transistor can be driven by this output. The emitter of the Darlington stage T1 is connected to the output AE. Through this terminal AE, the Darlington stage T1 is supplied with the emitter voltage (if necessary, the emitter should be raised, which saves dissipation losses).

The evaluation circuit 8 is provided for evaluating increased currents in the event of a short circuit or overload. The circuit 8 compares the reference voltage Ref S obtained by voltage divider resistors R1, R2, with the voltage drop, fed-in through terminal S1, from the external current measuring resistor ($R_{SC}$)9 disposed in the load circuit. The inputs of the evaluation circuit are therefore connected to the terminals RefS and S1.

The evaluation circuit 8 is formed for instance, of a comparator. It executes important actions if a suitable voltage is applied to its inputs. For one thing, it fulfills the OR condition of the gate 7 so that the capacitor which is externally connected to the terminal C1, is charged by the current source IC1 and the closed switch SW2. This happens, for instance, if too large a load current flows. The external capacitor is thus charged by the current source IC1 and the power output AC1 is switched off after a time delay. The current sink IC2 determines the thermal recovery time or the duration of the pause in cyclic attempts at reclosing. In addition, the evaluation circuit 8 influences the base current of the Darlington transistor T1 through the current source IA1 and the current sink IA2 in such a manner that the transistors T1 and T3 become current limiting. The current from the element IA1 is attenuated in the process and the current from element IA2 is amplified. In that way, the base can be technically controlled very well.

It is possible to advantagously accommodate the driving circuit as a functional unit on the integrated circuit in duplicate, according to the invention. In the drawing, the second, identical driving circuit has only been shown in the way of outlining. This second functional unit or driving circuit is connected to the first unit, and the common part is formed by dot-dash lines framed by the input terminal $U_{SCHW}$ by the output of the comparator 2, by the output of the comparator 3, by the voltage supply terminal AE and by the terminal RefS. The output $U_{REF}$ is available for both functional units.

The driving circuit according to the invention operates as follows: The signal input I1 is provided for addressing the output AC1.

If a voltage at the input I1 (as a "1" signal) exceeds the reference voltage applied to the terminal $U_{SCHW}$ by a given amount, the comparator 1 responds and brings the true or reference input of the AND gate 4 to "1" potential (condition: the input Jn is addressed by "0" signal and the Schmitt trigger SMT1 has an output at a "0" signal), the AND gate 4 conducts and opens the switch SW1, so that the current from the current source IA1 is no longer conducted off through the current source IA3 to negative potential. The current source IA1 now addresses the Darlington transistor T1, so that the transistor T1 conducts and switches the output AC1 into conduction. The external power transistor T3 is driven through the output AC1. The voltage supply for the emitter of the Darlington transistor T1 is fed through the terminal AE, i.e., the terminal AE is tied to a fixed potential.

In the event of a short circuit or an overload, the driving circuit according to the invention behaves as follows: Too large a load current results in an increased voltage drop at the current measuring resistor 9. This increased voltage drop is fed through the current sensing input S1 to the evaluation circuit 8 and is compared with the reference voltage, formed by the resistors R1 and R2, at the terminal RefS. With the increased voltage at the terminal S1, the evaluation circuit 8 has a decreasing effect on the current source IA1 and an increasing effect on the current source IA2, so that due to the decreased drive of the transistor T1, a defined current limitation for the Darlington transistor T1 and the power transistor T3 comes about.

The evaluation circuit 8 closes the switch SW2 through the OR gate 7 in case of an increased voltage drop at the terminal S1. The current source IC1 now charges a capacitor connected to the terminal C1. Disconnecting a power stage connected to the output AC1 in the event of an overload by the driving circuit according to the invention, is accomplished by the provision that the voltage from the externally connected capacitor addresses the Schmitt trigger SMT1 if the upper threshold of the Schmitt trigger SMT1 (thresholds, for instance, of 3 and 7.5 V) is exceeded. Then, a "1" signal is applied to the after-connected AND gate 4 (the AND gate is blocked), so that the AND gate 4 cuts off the Darlington transistor T1 and the power output AC1, respectively, by way of the closed switch SW1 and the current source IA3. By this disconnect action, the switch SW2 is reopened by the stages 8 and 7, since an increased load current no longer flows.

Upon reaching the upper switching threshold (7.5 V), the Schmitt trigger SMT1 simultaneously gives its "1" signal to the setting input of the Schmitt trigger SMT2, so that the latter is also switched into conduction. Then, the transistor T2 is switched into conduction, so that a trouble signal (for a horn or a lamp) is present at the output SM1.

The open switch SW2 inhibits the further charging of the capacitor at C1. Instead, the capacitor is discharged again by the current sink IC2. This discharge must proceed slowly because during current limiting, the power transistor T3 was stressed with a high dissipation loss and therefore, requires a long thermal recovery time. If the capacitor voltage falls below the value of 3 V, i.e. the lower threshold at the Schmitt trigger SMT1, the signal path through the AND gate 4 is released again (the AND gate 4 opens the switch SW1 and the stage T1 is switched into conduction). If the overload still persists, another disconnect action follows shortly after. These periodic connecting attempts (cycling) are repeated until the overload is eliminated. A condition for the connecting attempts, is that the resetting input R has "1" signal (continuous acknowledgement). During these connecting attempts the trouble indicating output SM1 remains conducting uninterruptedly, since the value of the voltage does not fall below the lower threshold of the Schmitt trigger SMT2 (2.5 V).

If the reset input R has a "0" signal, the Schmitt trigger SMT3 switches to a "0" signal as the capacitor voltage drops to 3.5 V and causes the switch SW2 to close again through the AND gate 5 and the OR gate 7, i.e., a capacitor discharge. With a 4 V capacitor voltage, the charging is then broken off again because the Schmitt trigger SMT3 blocks the AND gate 5 again.

This means: If the Schmitt trigger SMT1 has once switched to a "1" signal because of an overload and if the clearing input R has a "0" signal, then the Schmitt trigger SMT3 with its thresholds assures that the capacitor voltage always varies between 3.5 V and 4 V and the voltage does not drop below the lower threshold of the Schmitt trigger SMT1. Reclosing can therefore not occur, and the disturbance remains stored. It is only if the operating personnel takes action and gives a "1" signal to the clearing circuit input R, that a "0" signal is applied to the OR gate 7 through the comparator 2 and the AND gate 5. In this way, the switch SW2 is opened and the capacitor at the terminal C1 can discharge through the current sink IC2. If the lower threshold (3 V) of the Schmitt trigger SMT1 is reached by the voltage, the power output AC1 is again connected through the AND gate 4, the switch SW1 and the Darlington transistor T1.

Holding the capacitor voltage at 3.5 to 4 V in the stored-disturbance case has the advantage that in the case of acknowledgement through the input R, an acknowledgment delay occurs which corresponds to the discharging time of the capacitor from 3.5 to 4 V down to 3 V and is thereby considerably shorter than the duration of the pause or the recovery time which corresponds to the discharging time from 7.5 V to 3 V.

For a practical application it may be necessary to require a recovery time of, for instance, 5 sec. An acknowledgement delay of the same length would not be tolerable, however, since it might irritate the operating personnel who expect an immediate reaction to the acknowledgement.

The capacitor connected to the terminal C1 as the sole component, provides five different delay times which have a fixed relation to each other, due to the circuit, namely:

1. Disconnect delay of the power state in the event of a short circuit or an overload. The duration of this delay corresponds to the charging time of the capacitor with the switch SW2 closed through the current source IC1 (minus the current through the current sink IC2) between values of the capacitor voltage of for instance, 0 V and 7.5 V (the element responsible: SMT1).

2. Recovery time for the external power transistor T3. The recovery time is the waiting time after a disconnect action due to a short circuit or an overload, during which a reconnection cannot and must not occur under any circumstances. The length of the recovery time corresponds to the discharging time of the capacitor at the terminal C1 by the current sink IC2 between values of the capacitor voltage of, for instance, 7.5 and 3 V (the element responsible: SMT1).

In case of continuous overload and simultaneous continuous acknowledgement (input R="1" signal), the recovery time corresponds to the duration of the pauses between the reconnect attempts.

3. Pulse duration of the reconnect attempts or manual acknowledgement and non-corrected overload. This pulse duration corresponds to the charging time of the capacitor with the switch SW2 closed through the current source IC1, minus the current IC2, between values of the capacitor voltage of, for instance, 3 V and 7.5 V (the element responsible: SMT1).

4. Response delay of the acknowledgement signal in the case of manual acknowledgement. This is the spacing in time from 0-1 transition at the input R to the reconnection of the power output AC1. The duration corresponds to the discharging tome of the capacitor at the terminal C1 through the current sink IC2 between the values of the capacitor voltage of, for instance, 3.5 V to 4 V, and 3 V. Since the acknowledgement does not set in synchronously with the voltage which varies at the capacitor between 3.5 and 4 V, the discharge of the capacitor begins at some value of the capacitor voltage between 3.5 and 4 V. The response delay is over when the Schmitt trigger SMT1 releases the signal path again, i.e., for instance, 3 V has been reached (the elements responsible: SMT1, SMT3).

5. Switching-off delay of the disturbance alarm at the output SM1 after a trouble-free (successful) reconnection of the power output AC1. If the reconnection of the power output is successful due to continuous or manual acknowledgement after the overload is corrected, the output SM1 shortly after goes back into the blocked state. (The trouble alarm disappears). The duration of the delay corresponds to the discharging time of the capacitor through the current sink IC2 between values of the capacitor voltage of, for instance, 3 V and 2.5 V (elements responsible: SMT1 and SMT2).

This delay time is of particular usefulness in the case of an inductive overload at the output AC1. If the inductive overload persists, for instance, in a reconnect attempt, the current rises from zero until it finally becomes too large and represents an overload, due to the inductance after the connection is made. In the meantime, a case without fault is simulated. Normally, the trouble alarm would disappear and then return. This is prevented by the delay, because it bridges the time of the current rise in the case of inductive load. Therefore, there is also an uninterrupted trouble alarm in this case.

The transistor T2 disposed between the Schmitt trigger SMT2 and the output SM1 has an "open collector output", where the transistor becomes conducting in the case of a disturbance.

The foregoing is a description corresponding to German Application No. P 31 50 703.4, dated Dec. 21, 1981, the International priority of which is being claimed for the instant application, and which is hereby made part of this application. Any discrepancies between the foregoing specification and the aforementioned corresponding German application are to be resolved in favor of the latter.

I claim:

1. Driving circuit for short-circuit-proof readout stages with a plurality of protection-wired inputs and outputs, comprising a signal input, a first comparator having a first input connected to said signal input, a second input referred to a reference voltage and an output, a first AND gate being driven by said first comparator and having first, second and third inputs and an output, said first input being connected to said output of said first comparator, said first AND gate being switched into conduction if a positive voltage is present at said output of said first comparator, a first switch being operatively connected to said output of said first AND gate, said first switch being opened when said first AND gate is conducting and being connected to a negative potential when closed, first, second and third current sources, said first current source being connected to a supply potential, said third current source being connected to said first switch and being connected to the negative potential through said first switch when said first switch is closed, a Darlington driver stage having an emitter, having a collector output and having a base being connected to said third current source and being connected to said first current source for supplying said Darlington stage when said first switch is open, a power output being connected to said collector output of said Darlington stage, a voltage supply output being connected to said emitter of said Darlington stage, said second current source being shunted across said third current source and being connected to said base of said Darlington stage, an evaluation unit, said first and second current sources being connected to and addressed by said evaluation unit, a current sensor input and a threshold voltage output being connected to and influencing said evaluation unit, an OR gate being connected to and influenced by said evaluation unit, a second switch being operatively connected to said OR gate, a fourth current source and a current sink each being connected to said second switch, an input terminal for an external capacitor being connected to said second switch for selectively charging through said fourth current source and discharging through said current sink, first, second and third Schmitt triggers each having an output, each having a different switching threshold and each being connected to said external capacitor input terminal for receiving a capacitor charge, said second Schmitt trigger having a setting input, a second AND gate having first, second and third inputs and having an output connected to said OR gate for controlling external capacitor charging and discharging, said output of said first Schmitt trigger being connected to said second input of said first AND gate, to said first input of said second AND gate and to said setting input of said second Schmitt trigger, said output of said third Schmitt trigger being connected to said second input of said second AND gate, a disturbance alarm output, a second transistor stage being connected between said disturbance alarm output and said output of said second Schmitt trigger, an acknowledgement input, a second comparator having a first input connected to said acknowledgement input, a second input referred to the reference voltage and an output connected to said third input of said second AND gate, another input, and a third comparator having a first input connected to said other input, a second input referred to the reference voltage and an output connected to said third input of said first AND gate.

* * * * *